United States Patent
Hauser et al.

(10) Patent No.: US 7,036,216 B2
(45) Date of Patent: May 2, 2006

(54) METHOD AND APPARATUS FOR CONNECTING AT LEAST ONE CHIP TO AN EXTERNAL WIRING CONFIGURATION

(75) Inventors: Christian Hauser, Regensburg (DE); Martin Reiss, Regensburg (DE); Johann Winderl, Wackersdorf (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/252,453

(22) Filed: Sep. 23, 2002

(65) Prior Publication Data

US 2003/0066188 A1   Apr. 10, 2003

Related U.S. Application Data

(63) Continuation of application No. PCT/DE01/01107, filed on Mar. 22, 2001.

(30) Foreign Application Priority Data

Mar. 23, 2000   (DE) ................. 100 14 379

(51) Int. Cl.
 *H05K 3/34* (2006.01)
(52) U.S. Cl. ............ 29/840; 29/832; 29/843; 29/739; 257/778; 438/108
(58) Field of Classification Search ......... 29/834, 29/837–839, 843–852, 854, 739, 740, 832, 29/840, 842; 156/275.5, 275.7, 325; 228/33, 228/41, 173.1, 180.1, 180.21, 180.22, 182.21, 228/182.22; 438/613, 106–110, 117; 257/737, 257/738, 778, 774, 787, 690, 692, 678
See application file for complete search history.

(56) References Cited

U.S. PATENT DOCUMENTS

| | | | | |
|---|---|---|---|---|
| 4,731,645 A | | 3/1988 | Parmentier et al. | 357/80 |
| 4,907,062 A | * | 3/1990 | Fukushima | 257/684 |
| 5,147,815 A | | 9/1992 | Casto | 437/51 |
| 5,705,858 A | * | 1/1998 | Tsukamoto | 257/778 |
| 5,764,485 A | * | 6/1998 | Lebaschi | 257/774 |
| 5,870,289 A | * | 2/1999 | Tokuda et al. | 361/779 |
| 5,897,337 A | * | 4/1999 | Kata et al. | 438/613 |
| 5,920,123 A | * | 7/1999 | Moden | 29/832 |

FOREIGN PATENT DOCUMENTS

| | | |
|---|---|---|
| DE | 197 54 372 A1 | 9/1998 |
| DE | 198 31 634 A1 | 1/2000 |
| EP | 0 863 548 A2 | 9/1998 |
| JP | 08 008 293 A | 1/1996 |
| JP | 09 130 000 A | 5/1997 |
| JP | 10 209 205 A | 8/1998 |

(Continued)

*Primary Examiner*—Minh Trinh
*Assistant Examiner*—Donghai D. Nguyen
(74) *Attorney, Agent, or Firm*—Laurence A. Greenberg; Werner H. Stemer; Ralph E. Locher

(57) ABSTRACT

An electrically conductive connection is produced between a chip and an external wiring configuration that is kept at a distance from the chip by spacers. Electrically conductive contact material is introduced into recesses in the external wiring configuration in order to produce the electrically conductive connection. This can be carried out economically, and allows a mechanically very robust electrical connection from the chip pads to the external wiring planes.

16 Claims, 1 Drawing Sheet

FOREIGN PATENT DOCUMENTS

| | | |
|---|---|---|
| JP | 10 223 688 A | 8/1998 |
| JP | 10 335 382 A | 12/1998 |
| JP | 11 045 905 A | 2/1999 |
| JP | 11 074 309 A | 3/1999 |
| JP | 11 214 432 A | 8/1999 |
| JP | 2000 012 608 A | 1/2000 |

* cited by examiner

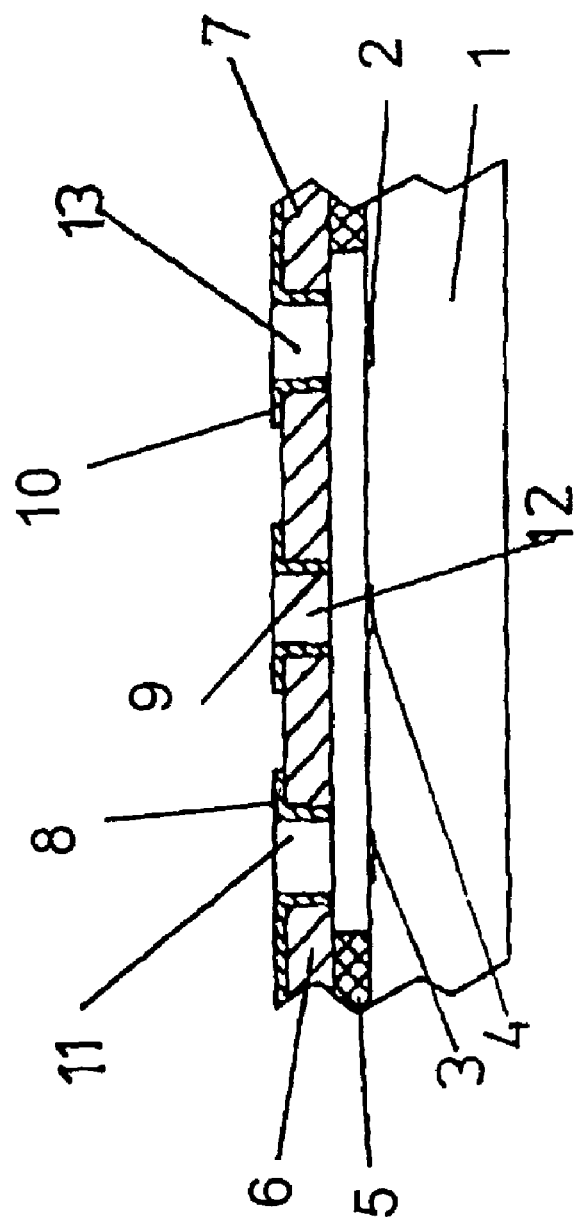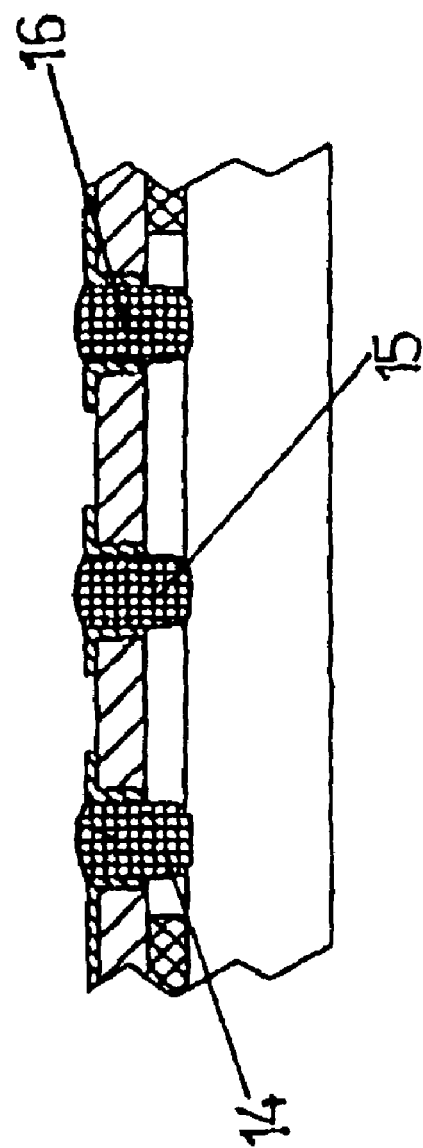

METHOD AND APPARATUS FOR CONNECTING AT LEAST ONE CHIP TO AN EXTERNAL WIRING CONFIGURATION

CROSS-REFERENCE TO RELATED APPLICATION

This application is a continuation of copending International Application No. PCT/DE01/01107, filed Mar. 22, 2001, which designated the United States and was not published in English.

BACKGROUND OF THE INVENTION

Field of the Invention

The invention relates to a method and an apparatus for connecting at least one chip to an external wiring configuration.

Until now, such an electrically conductive connection is customarily produced by wire bonding or lead bonding of a chip to its external wiring plane, for example, conductor tracks on a mount material. A wire bonding method is described, for example, in U.S. Pat. No. 5,147,815.

SUMMARY OF THE INVENTION

It is accordingly an object of the invention to provide a method for connecting at least one chip to an external wiring configuration.

With the foregoing and other objects in view there is provided, in accordance with the invention, a method for connecting at least one chip to an external wiring configuration. The method includes a step of: producing electrically conductive connections between the chip and the external wiring configuration by introducing an electrically conductive contact material into recesses in the external wiring configuration.

In accordance with an added feature of the invention, contact is made between a number of chips and corresponding external wiring configurations in one process step.

In accordance with an additional feature of the invention, when contact is made, the chips are still located on a wafer.

In accordance with another feature of the invention, the contact material is a paste.

In accordance with a further feature of the invention, the contact material is an electrically conductive adhesive.

In accordance with a further added feature of the invention, the contact material is a curing material.

In accordance with a further additional feature of the invention, the recesses are holes in the external wiring configuration.

In accordance with yet an added feature of the invention, the recesses are holes produced in a substrate.

In accordance with yet an additional feature of the invention, the external wiring configuration and the chip form a fine pitch ball grid array product.

In accordance with yet a further feature of the invention, the external wiring configuration and the chip form a chip size package product.

In accordance with yet a further added feature of the invention, the external wiring configuration and the chip form a wafer scale assembly product.

In accordance with a further additional feature of the invention, the external wiring configuration and the chip form a module assembly product.

In accordance with an added feature of the invention, the external wiring configuration and the chip form a chip on board product.

In accordance with an additional feature of the invention, a print process is used to introduce the electrically conductive contact material into recesses.

In accordance with another feature of the invention, the electrically conductive contact material is dispensed into recesses.

In accordance with a further feature of the invention, the chip is configured at a distance away from the external wiring configuration.

In accordance with a further added feature of the invention, spacers are used to keep the chip at a distance away from the external wiring configuration.

With the foregoing and other objects in view there is provided, in accordance with the invention, an apparatus for performing the method for connecting at least one chip to an external wiring configuration. The apparatus includes: a device for producing electrically conductive connections between the chip and the external wiring configuration by introducing an electrically conductive contact material into recesses in the external wiring configuration.

One object of the present invention is the efficient, economic production of an electrical connection between a chip (for example, its chip pads, that is to say the contact-making surfaces) with its external wiring plane (external wiring configuration, for example conductor tracks on a mount material).

The method is a very simple process which can be carried out cost-effectively. The mechanical complexity is very low. If required, sheathing of the bonding connection can be dispensed with, since the connection is intrinsically sufficiently robust. The connection can be produced very efficiently. According to the invention, in particular, the simultaneous and hence economic connection of a number of chips, which are still located on a wafer, to their external wiring planes is possible.

In particular, an electrically conductive adhesive, a self-curing material, or a material which cures when subjected to heat, is suitable as the electrically connecting contact material.

The contact material is preferably applied by a print process (printing-on) or dispensing (distribution of a compound).

The method can be used for products from the field of WSA (wafer scale assembly: connection production without having to disconnect the chips from the wafer), FBGA (fine pitch ball grid array: housing with solder balls on the lower face of the chip in order to allow simple assembly), and CSP (chip size package: housing whose size is matched to the chip size), module assembly or COB (chip on board).

Other features which are considered as characteristic for the invention are set forth in the appended claims.

Although the invention is illustrated and described herein as embodied in a method and apparatus for connecting a least one chip to an external wiring configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a cross sectional view of a chip that can make electrical contact with an external wiring plane; and FIG. 2 shows the configuration of FIG. 1 in which contact-making material has been introduced.

DESCRIPTION OF THE PREFERRED EMBODIMENTS

Referring now to the figures of the drawing in detail and first, particularly, to FIG. 1 thereof, there is shown a chip 1 with chip pads 2, 3, 4 (contact-making areas of the chip). Spacers (spacer cushion) 5 keep the chip pads 2, 3, 4 at a distance from an external wiring configuration 6–10 (a carrier material 6, 7 and conductor tracks 8, 9, 10).

In the area of the conductor tracks 8–10 in the external wiring configuration, recesses 11, 12, 13 are provided, for example, by drilling holes, etc. A connection will be produced between a chip pad and a conductor track etc in a recess. The illustrated recesses 11, 12, 13 are through-recesses, for example, through-holes, which extend through the external wiring configuration, in order to allow a simple introduction of a contact-making material in order to connect at least one chip to an external wiring configuration.

FIG. 2 shows the configuration from FIG. 1 with contact-making material 14, 15, 16 (in this case in the form of paste) introduced into the recesses 11, 12, 13. The contact-making material 14, 15, 16 electrically conductively connects at least one chip pad on the chip 1 to the external wiring configuration. In this case, contact can even be made between a number of chips, which are still located on a wafer, and their respectively associated external wiring configuration. This contact can be made very efficiently in one process step. The introduction process is carried out, for example, with a print process (printing on) or a dispensing process (painting on, etc).

The electrically conductive contact-making material may have any of a number of widely different consistencies, for example, it may be an electrically conductive adhesive, a self-curing material, or a material that is cured when subjected to heat, etc.

As can be seen from FIG. 2, there is no need for any sheath on the bonding connection, since the connection is itself sufficiently mechanically robust.

It can also be seen that a repair capability exists, that is to say, electrically unserviceable chips, for example, on a printed circuit board can be interchanged/replaced. In this case, the connection between the printed circuit board and the chip is disconnected, and if necessary, the printed circuit board is cleaned and prepared for a new contact-making process.

Contact can then be made with the new chip at the same location as the old (defective, removed) chip without having to scrap the printed circuit board. The printed circuit board is then tested once again, after which a further repair process is carried out, if necessary.

The spacers may be omitted if, for example, the external wiring plane is applied directly to the chips.

In summary, an electrically conductive connection is produced between a chip 1 and an external wiring configuration 6–10 by introducing an electrically conductive contact material 14–16 into recesses 11–13 in the external wiring configuration. Introducing the electrically conductive contact material 14–16 into the recesses 11–13 can be carried out economically, and this allows a mechanically very robust electrical connection between the chip pads 2–4 and their external wiring planes.

We claim:

1. A method for connecting at least one chip to an external wiring configuration, which comprises:
   providing a chip with chip pads;
   forming conductor tracks and recesses in an external wiring configuration;
   spacing the chip at a distance away from the external wiring configuration by placing spacer cushions between a surface of the chip and the external wiring configuration to keep the chip pads at a distance from the external wiring configuration and to form a gap between the chip and the external wiring configuration; and
   forming electrically conductive connections between the chip and the external wiring configuration by introducing an electrically conductive contact material into the recesses in the external wiring configuration such that the electrically conductive contact material is in physical contact with the chip pads and the conductor tracks of the external wiring configuration, and such that the chip is not in physical contact with the external wiring configuration in areas other than the electrically conductive contact material and spacer cushions, thus forming a cavity between the chip and the wiring configuration in the areas other than the electrically conductive contact material and spacer cushions, and the electrically conductive contact material providing a mechanically robust electrical connection between the chip pads and the conductor tracks of the external wiring configuration.

2. The method according to claim 1, wherein: contact is made between a number of chips and corresponding external wiring configurations in one process step.

3. The method according to claim 2, wherein: when contact is made, the chips are still located on a wafer.

4. The method according to claim 1, wherein: the contact material is a paste.

5. The method according to claim 1, wherein: the contact material is an electrically conductive adhesive.

6. The method according to claim 1, wherein: the contact material is a curing material.

7. The method according to claim 1, wherein: the recesses are holes in the external wiring configuration.

8. The method according to claim 1, wherein: the recesses are holes in a substrate.

9. The method according to claim 1, wherein: the external wiring configuration and the chip form a fine pitch ball grid array product.

10. The method according to claim 1, wherein: the external wiring configuration and the chip form a chip size package product.

11. The method according to claim 1, wherein: the external wiring configuration and the chip form a wafer scale assembly product.

12. The method according to claim 1, wherein: the external wiring configuration and the chip form a module assembly product.

13. The method according to claim 1, wherein: the external wiring configuration and the chip form a chip on board product.

14. The method according to claim 1, which comprises: using a print process to introduce the electrically conductive contact material into recesses.

15. The method according to claim 1, which comprises: dispensing the electrically conductive contact material into recesses.

16. An apparatus for connecting at least one chip to an external wiring configuration, the apparatus comprising:
chip pads provided on the chip;
conductor tracks and recesses formed in the external wiring configuration;
spacer cushions for keeping the chip at a distance away from the external wiring configuration, said spacer cushions being placed on a surface of the chip to keep said chip pads at a distance from the external wiring configuration and to form a gap between the chip and the external wiring configuration; and a device for forming electrically conductive connections between the chip and the external wiring configuration by introducing an electrically conductive contact material into recesses in the external wiring configuration such that said electrically conductive contact material is in physical contact with said chip pads and said conductor tracks of the external wiring configuration, and such that the chip is not in physical contact with the external wiring configuration in areas other than said electrically conductive contact material and spacer cushions, thus a cavity being formed between the chip and the wiring configuration in said areas other than said electrically conductive contact material and spacer cushions;
said electrically conductive contact material providing a mechanically robust electrical connection between said chip pads and said conductor tracks of the external wiring configuration.

* * * * *